United States Patent
Nakao et al.

(10) Patent No.: US 8,040,414 B2
(45) Date of Patent: Oct. 18, 2011

(54) A/D CONVERTER-INCORPORATED SOLID-STATE IMAGING DEVICE

(75) Inventors: Toshinobu Nakao, Osaka (JP); Masayuki Hirota, Kyoto (JP); Masashi Murakami, Kyoto (JP); Kenji Watanabe, Osaka (JP); Masaya Hirose, Kyoto (JP)

(73) Assignee: Panasonic Corporation, Osaka (JP)

( * ) Notice: Subject to any disclaimer, the term of this patent is extended or adjusted under 35 U.S.C. 154(b) by 405 days.

(21) Appl. No.: 12/409,988

(22) Filed: Mar. 24, 2009

(65) Prior Publication Data
US 2009/0284629 A1    Nov. 19, 2009

(30) Foreign Application Priority Data

May 13, 2008   (JP) ................................ 2008-125852

(51) Int. Cl.
*H04N 5/335*   (2011.01)
*H03M 1/00*    (2006.01)
(52) U.S. Cl. ...................................... 348/294; 341/120
(58) Field of Classification Search ............... 250/208.1; 341/120; 348/187, 241, 294, 308
See application file for complete search history.

(56) References Cited

U.S. PATENT DOCUMENTS

| | | | |
|---|---|---|---|
| 6,057,891 A * | 5/2000 | Guerin et al. | 348/572 |
| 6,188,057 B1 | 2/2001 | Misek | |
| 6,396,426 B1 | 5/2002 | Balard et al. | |
| 6,903,670 B1 | 6/2005 | Lee et al. | |
| 7,152,010 B1 * | 12/2006 | Tsyrganovich | 702/107 |
| 7,864,089 B2 * | 1/2011 | Lee et al. | 341/118 |

FOREIGN PATENT DOCUMENTS

| | | |
|---|---|---|
| JP | 09-247494 | 9/1997 |
| JP | 2000-324404 | 11/2000 |
| JP | 3730442 | 10/2005 |
| JP | 2005-323331 | 11/2005 |

* cited by examiner

*Primary Examiner* — David N Spector
(74) *Attorney, Agent, or Firm* — McDermott Will & Emery LLP

(57) ABSTRACT

The solid-state imaging device includes: a first node for receiving a first signal from outside the solid-state imaging device; a second node for receiving a second signal from outside the solid-state imaging device; a test signal selection circuit for outputting the first signal received at the first node and the second signal received at the second node as a test signal by switching between the first and second signals at desired timing; and a test signal input circuit for supplying the test signal from the test signal selection circuit to an input of the A/D converter.

10 Claims, 10 Drawing Sheets

US 8,040,414 B2

A/D CONVERTER-INCORPORATED SOLID-STATE IMAGING DEVICE

CROSS-REFERENCE TO RELATED APPLICATIONS

This application claims priority under 35 U.S.C. §119 on Patent Application No. 2008-125852 filed in Japan on May 13, 2008, the entire contents of which are hereby incorporated by reference.

BACKGROUND OF THE INVENTION

The present invention relates to a solid-state imaging device incorporating an A/D converter, and more particularly to a solid-state imaging device having a function for testing of the A/D converter. The present invention is applied to CMOS image sensors used for image sensor-embedded cellular phones, digital cameras, video cameras and the like, for example.

In recent years, various schemes have been proposed for signal readout in solid-state imaging devices. In general, a column parallel output type solid-state imaging device is often used in which one row of pixels in a pixel array are selected and pixel signals generated in the selected pixels are read in parallel via vertical signal lines. Also, a solid-state imaging device provided with a column A/D converter has appeared in which an A/D conversion circuit is provided for each vertical signal line for converting a pixel signal from analog to digital. For testing of such an A/D converter, a method in which a test circuit is provided inside the solid-state imaging device for testing has been proposed as in Japanese Laid-Open Patent Publication No. 2000-324404 (Patent Document 1), for example, in addition to a method of testing using optoelectronic conversion of pixels.

Hereinafter, an embodiment disclosed in Patent Document 1 will be described with reference to FIG. 10, which schematically illustrates a solid-state imaging device provided with a test circuit for testing an A/D converter.

As shown in FIG. 10, the solid-state imaging device 100 includes a timing generation circuit 2, a load transistor group 3, a pixel region 4, a vertical scanning circuit 5, a reference voltage generator 6, an A/D converter 7, a buffer (BUF) 8, a horizontal scanning circuit 9, a control circuit (CONT) 10, a test signal input circuit 11 and a test signal generation circuit 12. These circuits are formed on the same chip.

The test signal generation circuit 12 generates a test signal TEST for testing the A/D converter 7 under control with a control signal CN3 from the control circuit 10.

The test signal input circuit 11 allows the test signal TEST to enter vertical signal lines (14-1 to 14-n), whereby the test signal TEST is inputted into the A/D converter 7 via the vertical signal lines (14-1 to 14-n).

Switch transistors (11-1 to 11-n) of the test signal input circuit 11 turn ON/OFF under control with a control signal CN2 from the control circuit 10. The control circuit 10 is therefore provided with the function of turning the load transistor group 3 OFF to make 1s the impedance of the vertical signal lines (14-1 to 14-n) high and the function of controlling the test signal input circuit 11 at least during the test period, in addition to the function of controlling the reference voltage generator 6.

The control circuit 10 turns the load transistor group 3 OFF with a control signal CN1, and controls the test signal input circuit 11 with the control signal CN2 to permit the test signal TEST to enter the vertical signal lines (14-1 to 14-n).

In testing of the A/D converter 7, the control circuit 10 turns the load transistor group 3 OFF with the control signal CN1. Note that at this time pixel cells 13 are also OFF and thus the impedance of the vertical signal lines (14-1 to 14-n) becomes high.

The test signal generation circuit 12 outputs the test signal TEST in response to the control signal CN3 from the control circuit 10. The test signal TEST is inputted into the A/D converter 7 via the test signal input circuit 11 and the vertical signal lines (14-1 to 14-n) with the control signal CN2 from the control circuit 10.

The A/D converter 7 compares the test signal TEST with a reference voltage VREF to convert the test signal TEST to a digital signal. The converted digital signal is outputted outside the solid-state imaging device 100, for example, via the buffer 8. By evaluating the outputted digital signal, the characteristics of the A/D converter 7 are measured.

As described above, in the solid-state imaging device 100 shown in FIG. 10, the test signal TEST is inputted into the A/D converter 7 via the vertical signal lines (14-1 to 14-n). Hence, when the area of the pixel region 4 is too large to neglect the effect of the load of the vertical signal lines (14-1 to 14-n), it will be difficult to send the test signal TEST to the A/D converter 7 as a highly precise signal (first problem).

When an analog signal processing circuit (for example, a circuit for amplifying analog signals from the pixel cells 13, etc.) is placed between the pixel region 4 and the A/D converter 7, the test signal TEST will be affected by this analog signal processing circuit. As a result, it will be difficult to send the test signal TEST to the A/D converter 7 as a highly precise signal (second problem).

A signal supplied to the A/D converter 7 must have two signal levels, as described in Japanese Laid-Open Patent Publication No. 9-247494 (Patent Document 2) and Japanese Laid-Open Patent Publication No. 2005-323331 (Patent Document 3); namely, a pixel reset signal level supplied from the pixel cells 13 to the A/D converter 7 via the vertical signal lines (14-1 to 14-n) when the pixel cells 13 is reset, and a pixel signal level supplied from the pixel cells 13 to the A/D converter 7 via the vertical signal lines (14-1 to 14-n) when a charge stored in a photodiode of each pixel cell 13 is read from the photodiode.

Also, the pixel reset signal level and the pixel signal level must be arranged in time series during one horizontal period or one horizontal blanking period, to allow these signal levels to be supplied to the A/D converter 7 at desired timing.

For the test signal TEST prepared for testing the A/D converter 7, it is also requested to have these two signal levels. Assuming herein that the test signal corresponding to the pixel reset signal level is called a "reference signal" and the test signal corresponding to the pixel signal level is called an "amplitude signal", the test signal TEST is composed of the two kinds of signals; the reference signal and the amplitude signal. This definition of the reference signal and the amplitude signal also applies to embodiments of the present invention described later.

In the timing chart shown in Patent Document 1, also, the test signal TEST is composed of two kinds of signals, the reference signal and the amplitude signal, arranged in time series although not specifically described in Patent Document 1. Hence, the test signal generation circuit 12 must generate the reference signal and the amplitude signal, and these signals must independently have a level of precision necessary for the A/D converter 7 or higher. If the amplitude signal is generated as a ramp signal, the test signal generation circuit 12 needs a circuit for generating a ramp signal, and this increases the circuit scale of the test signal generation circuit 12 (third problem).

Also, a test for checking the precision of signals generated by the test signal generation circuit 12 is necessary for each solid-state imaging device, and this increases the test time (Fourth problem).

To solve the third and fourth problems described above, Patent Document 1 additionally describes the case of providing the test signal generation circuit 12 outside the solid-state imaging device 100, namely, performing the testing with an IC tester. However, since the solid-state imaging device has only one pad for receiving a test signal from the IC tester, the IC tester is required to have a mechanism permitting switching of the test signal between the reference signal and the amplitude signal at desired timing as required during one horizontal period or one horizontal blanking period. In particular, in the case of generating the amplitude signal as a ramp signal, an IC tester excellent in response permitting quick return to the voltage value of the reference signal is necessary. This increases both the man-hour needed to develop an IC tester satisfying this requirement and the cost required for this development (fifth problem).

The IC tester is required to supply the reference signal and the amplitude signal to the A/D converter 7 at desired timing. For this purpose, the IC tester must synchronize the timing at which the reference signal and the amplitude signal are supplied to the solid-state imaging device 100 with the timing at which the reference signal and the amplitude signal lo are supplied to the A/D converter 7. In Patent Document 1, a solid-state imaging device operating at a comparatively low speed satisfies the above. However, for a solid-state imaging device in which an external clock is multiplied with a multiplication circuit to operate the A/D converter at high speed, as described in Patent Document 3, for example, it is difficult to synchronize the timing at which the reference signal and the amplitude signal are supplied to the solid-state imaging device 100 from the IC tester with the timing at which the reference signal and the amplitude signal are supplied to the A/D converter 7 (sixth problem).

To solve the fifth and sixth problems described above, there is a method in which the reference signal is used as the reset signal for the pixel cells 13, for example, although not specifically described in Patent Document 1. With this method, since the reset signal for the pixel cells 13 can be controlled with the timing generation circuit 2 and the test signal input circuit 11 can be controlled with the control circuit 10, both the generation timing of the reference signal and the external input timing of the amplitude signal are completed within the solid-state imaging device. The only thing left to do is therefore sending the ramp signal that is to be the amplitude signal from the IC tester at arbitrary timing. Hence, the fifth and sixth problems can be solved even with the technology of Patent Document 1. However, the use of the reference signal as the reset signal for the pixel cells 13 may raise the possibility that the voltage value of the reference signal may differ among the vertical signal lines (14-1 to 14-n) due to variations in the characteristics of the pixel cells 13. It is therefore difficult to make the voltage value of the reference signal agree with the 0-point voltage value of the amplitude signal supplied from the IC tester. As a result, high-precision testing with an amplitude signal having a small amplitude, in particular, will be difficult, causing a new problem.

Note that Patent Document 1 also demonstrates, as a method for testing the minimum to maximum values of the amplitude signal at one time, an example in which resistors are provided between the adjacent vertical signal lines (14-1 to 14-n) and two test signals generated by the IC tester are inputted via two pads of the solid-state imaging device. This is however disadvantageous in that a test for checking the characteristics of the individual A/D converters is not allowed and that a test for checking variations among the A/D converters is not allowed.

SUMMARY OF THE INVENTION

The solid-state imaging device of the present invention includes: a pixel region having a plurality of pixel cells arranged in an array, each of the pixel cells including an optoelectronic conversion element; a pixel cell selection circuit for selecting pixel cells in the pixel region; a plurality of vertical signal lines to which signals at pixel cells selected by the pixel cell selection circuit are read; and an A/D converter for A/D-converting signals read to the vertical signal lines, wherein the solid-state imaging device further includes: a first node for receiving a first signal inputted from outside the solid-state imaging device; a second node for receiving a second signal inputted from outside the solid-state imaging device; a test signal selection circuit for outputting the first signal received at the first node and the second signal received at the second node as a test signal by switching between the first signal and the second signal at desired timing; and a test signal input circuit for supplying the test signal from the test signal selection circuit to an input of the A/D converter, the first signal is a signal corresponding to a pixel reset signal level supplied from the pixel cells to the A/D converter via the vertical signal lines when the pixel cells are reset, and the second signal is a signal corresponding to a pixel signal level supplied from the pixel cells to the A/D converter via the vertical signal lines when charges stored in the optoelectronic conversion elements of the pixel cells are read from the optoelectronic conversion elements.

In the solid-state imaging device described above, in testing of the A/D converter, two signals, the first signal corresponding to the pixel reset signal level and the second signal corresponding to the pixel signal level, are inputted into the solid-state imaging device. The test signal selection circuit outputs the first signal and the second signal by selectively switching between the first and second signals to thereby generate a test signal having the first and second signals arranged in time series at desired timing. The resultant test signal is supplied to the A/D converter via the test signal input circuit. This configuration eliminates the necessity of providing a test signal generation circuit for generating the test signal having the first and second signals arranged in time series inside the solid-state imaging device. This further eliminates the necessity of testing for checking whether or not the test signal generated by the test signal generation circuit has desired precision for each solid-state imaging device. Hence, the problem of increasing the circuit scale and the problem of increasing the test time can be solved.

DESCRIPTION OF THE PREFERRED EMBODIMENTS

Figure 1:
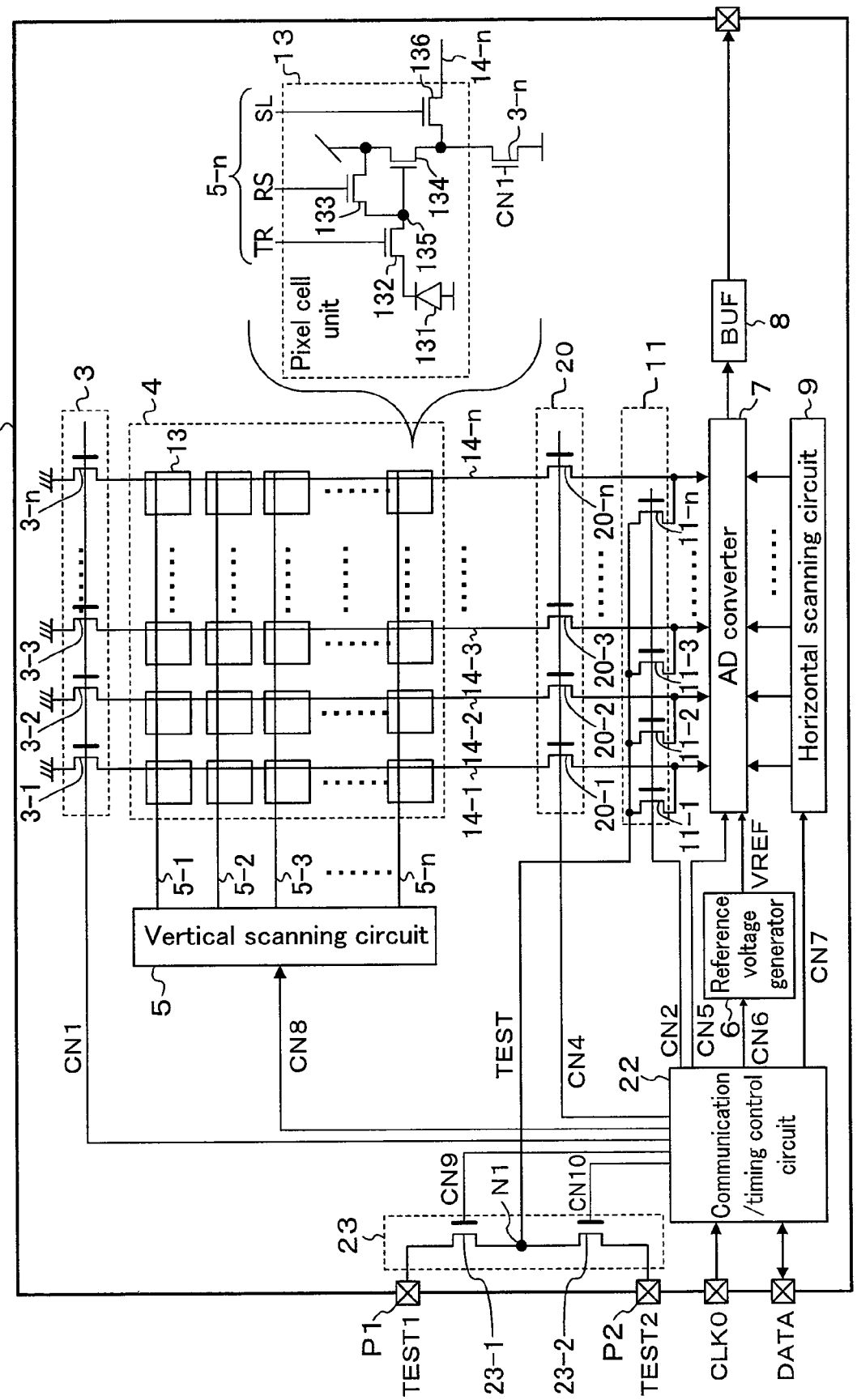
FIG. 1 is a block diagram of a solid-state imaging device of Embodiment 1.

Hereinafter, preferred embodiments of the present invention will be described with reference to the accompanying drawings. Note that components denoted by the same reference numerals operate in substantially the same way, and thus repeated description of such components is omitted in some cases.

Embodiment 1

FIG. 1 is a block diagram of a solid-state imaging device of Embodiment 1. Referring to FIG. 1, the solid-state imaging device 1 includes a load transistor group 3, a pixel region 4, a vertical scanning circuit 5, a reference voltage generator 6, an A/D converter 7, a buffer (BUF) 8, a horizontal scanning circuit 9, a test signal input circuit 11, a vertical signal line connection circuit 20, a communication/timing control circuit 22 and a test signal selection circuit 23. These circuits are formed inside the solid-state imaging device 1 (on the same chip).

The pixel region 4 has a plurality of pixel cells 13 for converting light to signal charge arranged in a matrix. The plurality of pixel cells 13 are formed on a p-type substrate or in a P-well on an n-type substrate. Each pixel cell 13 includes a photodiode 131, a transfer transistor 132, a reset transistor 133, an amplifying transistor 134 and a pixel selection transistor 136. The photodiode 131 performs optoelectronic conversion of 10 incident light and stores the resultant signal charge. The transfer transistor 132 transfers the signal charge stored in the photodiode 131 to a floating diffusion layer portion 135. The floating diffusion layer portion 135 temporarily stores the signal charge transferred from the photodiode 131. The amplifying transistor 134 amplifies the signal charge stored in the floating diffusion layer portion 135. The reset transistor 133 resets the signal charge is stored in the floating diffusion layer portion 135. The pixel selection transistor 136 outputs the signal charge amplified by the amplifying transistor 134 to a vertical signal line 14-$n$.

Figure 10:
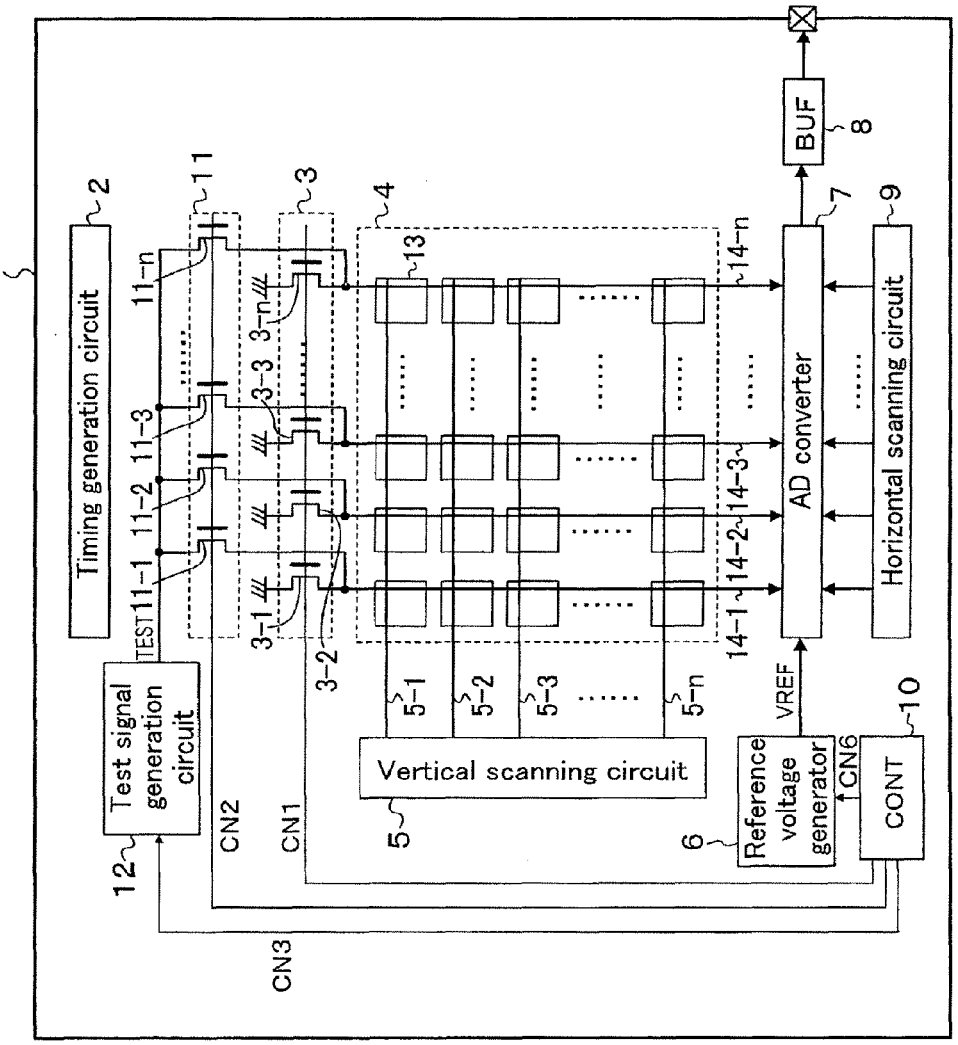
FIG. 10 is a block diagram of a conventional solid-state imaging device.

The communication/timing control circuit 22, receiving a clock CLK0 and data DATA from outside the solid-state imaging device 1, outputs signals (clock signals, pulse signals, control signals, etc.) CN1 to CNn necessary for the individual blocks. In FIG. 1, the signals CN1 to CNn are illustrated as one-bit signal lines for the sake of convenience. However, if a plurality of signals are necessary for a given block, the relevant one of the signals CN1 to CNn should be considered to include the number of signals necessary for the block, not limited to one bit. Note that the communication/timing control circuit 22 includes the functions of the timing generation circuit 2 and the control circuit 10 shown as prior art in FIG. 10. Hence, a new signal CNn that is not shown in FIG. 10 is allocated to each of the following blocks: the signal CN5 is supplied as a signal necessary for the A/D converter 7; the signal CN7 as a signal necessary for the horizontal scanning circuit 9; and the signal CN8 as a signal necessary for the vertical scanning circuit 5.

The load transistor group 3 constitutes part of a detection amplifier circuit for detecting signal charges from the pixel cells 13 as analog signals. A plurality of load transistors (3-1 to 3-$n$) in the load transistor group 3 correspond to a plurality of vertical signal lines (14-1 to 14-$n$). Each of the load transistors (3-1 to 3-$n$) is connected between one terminal of the corresponding vertical signal line (any of 14-1 to 14-$n$) and the ground node, and is controlled with the signal CN1 from the communication/timing control circuit 22.

The vertical scanning circuit 5 selects pixel cells 13 sequentially by horizontal signal line (5-1 to 5-$n$).

The reference voltage generator 6 generates a reference voltage VREF to be used as the reference of A/D conversion by the A/D converter 7 in response to the control signal CN6 from the communication/timing control circuit 22.

The horizontal scanning circuit 9 selects A/D-converted digital signals from the A/D converter 7 sequentially by vertical signal line (14-1 to 14-$n$) and transfers the selected signals to the buffer 8.

The buffer 8 outputs the digital signals transferred from the horizontal scanning circuit 9 outside the solid-state imaging device 1, for example, at low impedance.

The vertical signal line connection circuit 20 is a switch circuit having the function of connecting/disconnecting the vertical signal lines (14-1 to 14-$n$) to/from the inputs of the A/D converter 7. Under control with the control signal CN4 from the communication/timing control circuit 22, the vertical signal line connection circuit 20 connects the vertical signal lines (14-1 to 14-$n$) to the inputs of the A/D converter 7 during normal operation of the solid-state imaging device 1 as an image sensor, and disconnects the vertical signal lines (14-1 to 14-$n$) from the inputs of the A/D converter 7 during testing of the A/D converter 7.

The vertical signal line connection circuit 20 includes a plurality of switch transistors (20-1 to 20-$n$), which correspond to the plurality of vertical signal lines (14-1 to 14-$n$). Each of the switch transistors (20-1 to 20-$n$) is connected between the other terminal of the corresponding vertical signal line (any of 14-1 to 14-$n$) and the corresponding input of the A/D converter 7, and turns ON/OFF under control with the control signal CN4 from the communication/timing control circuit 22.

The test signal selection circuit 23 includes transistors 23-1 and 23-2. The transistor 23-1 is connected between a pad P1 and a node N1 and turns ON/OFF under control with the control signal CN9. The transistor 23-2 is connected between a pad P2 and the node N1 and turns ON/OFF under control with the control signal CN10. The pad P1 receives a reference signal TEST1 from outside the solid-state imaging device 1, and the pad P2 receives an amplitude signal TEST2 from outside the solid-state imaging device 1. The test signal selection circuit 23 switches the transistors 23-1 and 23-2 ON/OFF in response to the control signals CN9 and CN10 to thereby output the reference signal TEST1 and the amplitude signal TEST2 arranged in time series at desired timing from the node N1 as the test signal TEST.

The test signal input circuit 11 is a switch circuit having a function for connection/disconnection of the node N1 from which the test signal TEST is supplied to/from the inputs of the A/D converter 7. The test signal input circuit 11 includes a plurality of switch transistors (11-1 to 11-$n$) that correspond to a plurality of A/D conversion circuits (not shown in FIG. 1; to be described later) of the A/D converter 7. Each of the switch transistors (11-1 to 11-n), connected between the node N1 and the input of the corresponding A/D conversion circuit, turns ON/OFF under control with the control signal CN2 from the communication/timing control circuit 22. When the A/D converter 7 is tested, the test signal input circuit 11 turns the switch transistors (11-1 to 11-n) ON in response to the control signal CN2, to thereby allow the test signal TEST to enter the inputs of the A/D converter 7.

When the solid-state imaging device 1 is normally used as an image sensor, the A/D converter 7 compares analog signals inputted from the pixel cells 13 via the vertical signal lines (14-1 to 14-n) and the vertical signal line connection circuit 20 with the reference voltage VREF line by line to convert the analog signals to digital signals. The converted digital signals are outputted outside the solid-state imaging device 1, for example, via the buffer 8. When being tested, the A/D converter 7 compares the test signal TEST with the reference voltage VREF line by line to convert the test signal to digital signals. The A/D converter 7 holds the converted digital signals during one horizontal period. Thereafter, the converted digital signals are outputted outside the solid-state imaging device 1, for example, via the buffer 8. By evaluating the outputted digital signals, the characteristics of the A/D converter 7 are measured.

Figure 2:
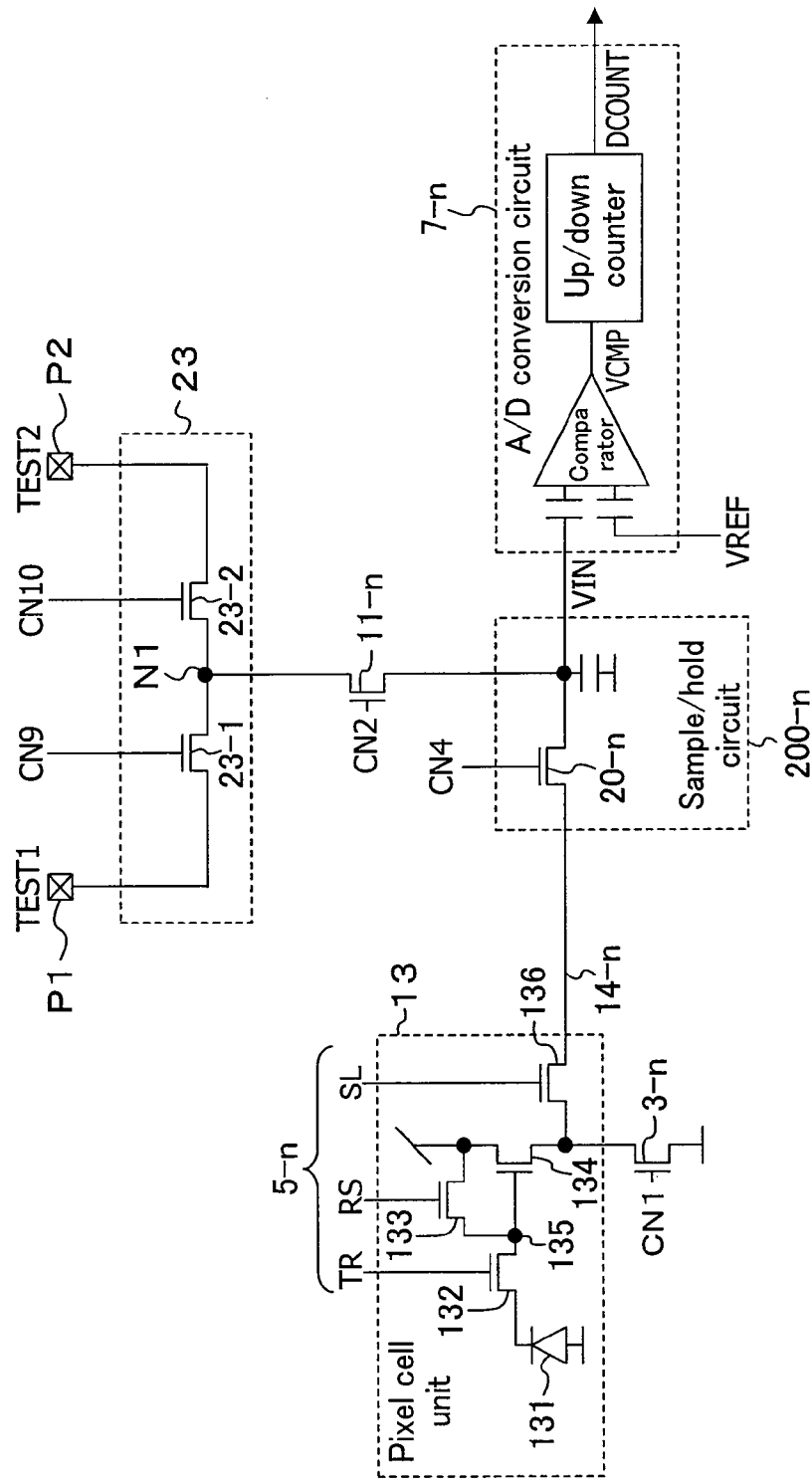
FIG. 2 is a view showing a circuit configuration of a pixel cell corresponding to one of a plurality of vertical signal lines through its corresponding A/D conversion circuit.

A specific example of the A/D converter 7 includes a column A/D converter. In the column A/D converter 7, a plurality of A/D conversion circuits (7-1 to 7-n) are provided to correspond to the plurality of vertical signal lines (14-1 to 14-n) for executing A/D conversion for individual columns (vertical signal lines). FIG. 2 shows a circuit configuration of a pixel cell 13 corresponding to one (14-n) of the plurality of vertical signal lines (14-1 to 14-n) through the A/D conversion circuit 7-n. This configuration also applies to the other vertical signal lines.

Although not shown in FIG. 1, sample/hold circuits (200-1 to 200-n) are placed between the pixel region 4 and the A/D converter 7 for the respective vertical signal lines (14-1 to 14-n). In FIG. 2, the sample/hold circuit 200-n for the vertical signal line 14-n is shown. This configuration also applies to the sample/hold circuits for the other vertical signal lines. A feature of this configuration is that the switch transistor 20-n of the vertical signal line connection circuit 20 also has the function of switching the sample/hold circuit 200-n between its sample state and hold state. This eliminates the necessity of separately providing the switch transistors (20-1 to 20-n) of the vertical signal line connection circuit 20, and thus prevents the circuit area from increasing.

Figure 3:
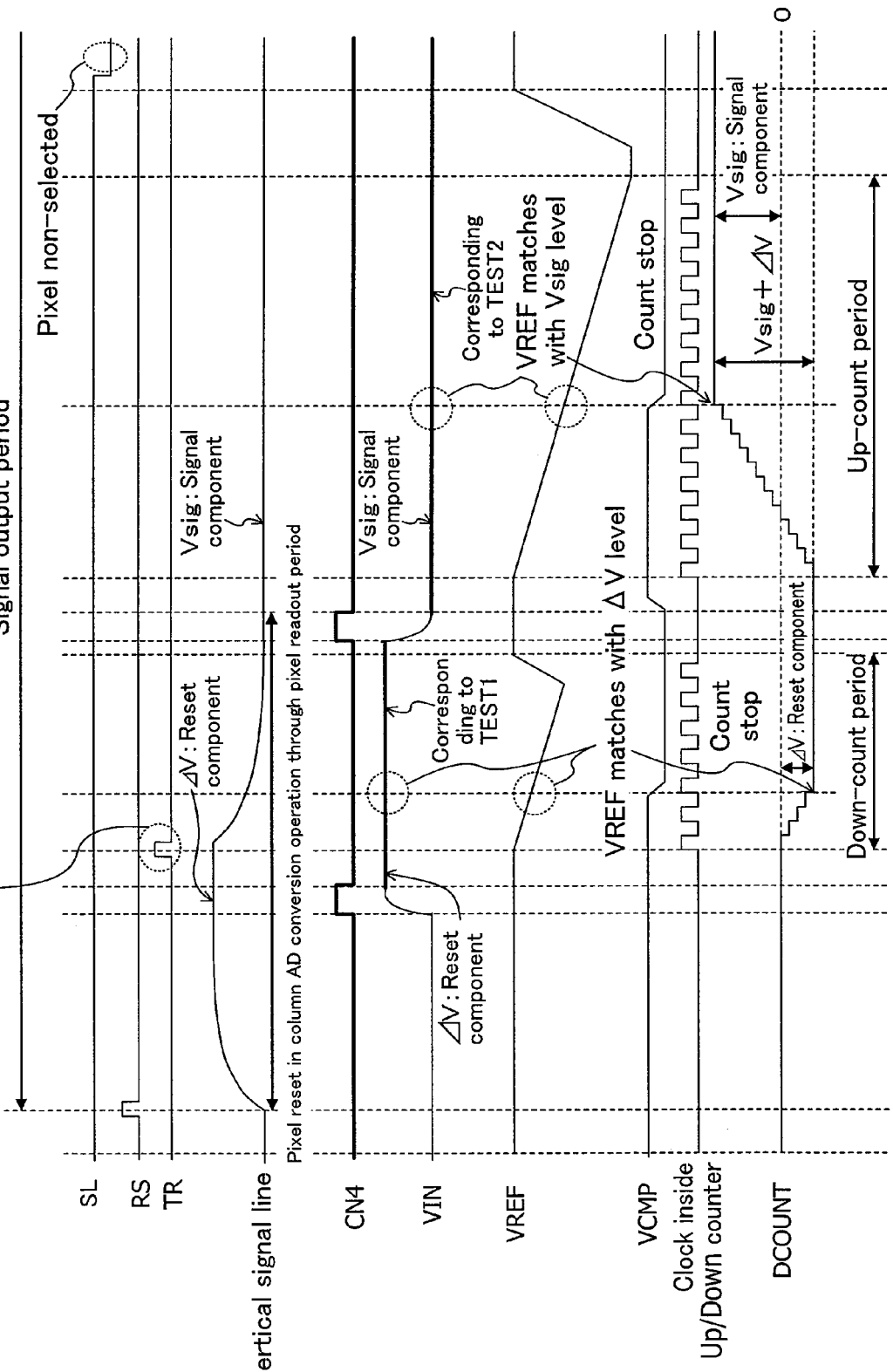
FIG. 3 is a timing chart at image sensing observed when a sample/hold circuit is provided.
Figure 4:
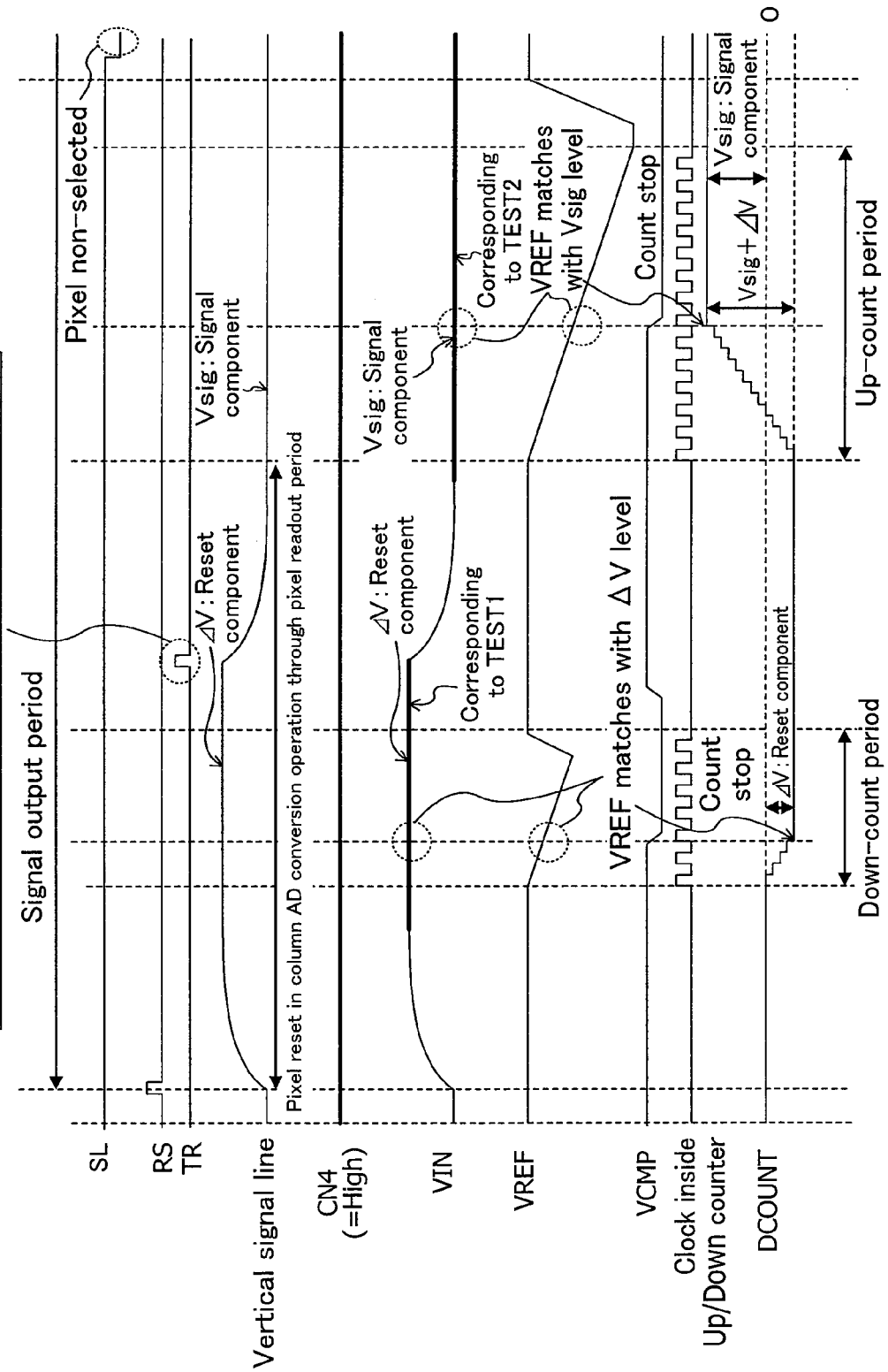
FIG. 4 is a timing chart at image sensing observed when no sample/hold circuit is provided.

FIG. 3 shows a timing chart observed when the solid-state imaging device 1 configured as described above operates as a normal image sensor. This operation is substantially the same as existing solid-state imaging devices provided with sample/hold circuits. With the sample/hold circuit (any of 200-1 to 200-n) being placed, a signal component Vsig can be read during down-counting of the A/D conversion circuit (any of 7-1 to 7-n), and thus high-speed operation is permitted. For comparison, FIG. 4 shows a timing chart observed when the sample/hold circuits (200-1 to 200-n) are not provided. In this case, the signal component Vsig cannot be read until the down-count period of the A/D conversion circuit (any of 7-1 to 7-n) is terminated. Although it is preferred to provide the sample/hold circuits (200-1 to 200-n) in embodiments of the present invention, the present invention is also applicable to a solid-state imaging device having no sample/hold circuits. In this case, however, the circuit area will increase because the switch transistors (20-1 to 20-n) of the vertical signal line connection circuit 20 must be provided separately.

The reference signal TEST1 received at the pad PI shown in FIG. 1 is a signal corresponding to a reset component ΔV of VIN in FIGS. 3 and 4 (signal supplied to the A/D conversion circuits (7-1 to 7-n) via the vertical signal lines (14-1 to 14-n); see FIG. 2). The amplitude signal TEST2 received at the pad P2 shown in FIG. 1 is a signal corresponding to the signal component Vsig of VIN in FIGS. 3 and 4.

Next, the operation of the solid-state imaging device 1 of this embodiment observed when the A/D converter 7 is tested will be described.

In testing of the A/D converter 7, the switch transistors (20-1 to 20-n) of the vertical signal line connection line 20 are kept "OFF" with the control signal CN4. The vertical signal lines (14-1 to 14-n) are therefore electrically discontinued from the inputs of the A/D converter 7 (inputs of the A/D conversion circuits (7-1 to 7-n)). Hence, the load transistor group 3, the pixel region 4 and the vertical scanning circuit 5 may be in any operation state.

It is necessary to supply the test signal TEST to the A/D converter 7 as the reference signal and the amplitude signal prior to the ramp period of the reference voltage VREF. The reference signal and the amplitude signal are respectively received at the pads P1 and P2 as TEST1 and TEST2 from outside the solid-state imaging device 1. The test signal selection circuit 23 then generates the test signal TEST having the reference signal TEST1 and the amplitude signal TEST2 arranged in time series at desired timing and sends the test signal TEST to the A/D converter 7. This will be described more specifically with reference to the timing chart of FIG. 5.

The reference signal TEST1 is received at the pad P1 from outside the solid-state imaging device 1 at all times as a voltage value (V0). The amplitude signal TEST2 is received at the pad P2 from outside the solid-state imaging device 1 as any of voltage values V0 to Vn for at least the time period of t0 to t9.

The communication/timing control circuit 22 makes the control signal CN9 high and the control signal CN10 low for the time period of t0 to t3 during which the reference signal is generated. This turns the transistor 23-1 ON and the transistor 23-2 OFF, whereby the test signal selection circuit 23 outputs the reference signal TEST1 having the voltage value (V0) from the node N1 as the test signal TEST. The communication/timing control circuit 22 also makes the control signal CN2 high for the time period of t1 to t2 during which the A/D converter 7 captures the reference signal. In response to this, the switch transistors (11-1 to 11-n) of the test signal input circuit 11 turn ON to allow the reference signal to be supplied to the A/D converter 7 during the reference signal capture period of t1 to t2. At this time, the reference voltage generator 6 is generating the reference voltage VREF having a voltage value (R0). Hence, the A/D converter 7 receives the voltage value (V0) of the reference signal and the voltage value (R0) of the reference voltage VREF, to begin with generating the initial value for A/D conversion.

The communication/timing control circuit 22 then makes the control signal CN9 low and the control signal CN10 high for the time period of t3 to t9 during which the amplitude signal is generated. This turns the transistor 23-1 OFF and the transistor 23-2 ON, whereby the test signal selection circuit 23 outputs the amplitude signal TEST2 having a voltage value of any of V0 to Vn from the node N1 as the test signal TEST. The communication/timing control circuit 22 also makes the control signal CN2 high for the time period of t4 to t5 during which the A/D converter 7 captures the amplitude signal. In response to this, the switch transistors (11-1 to 11-n) of the test signal input circuit 11 turn ON to allow the amplitude signal to be supplied to the A/D converter 7 during the amplitude signal capture period of t4 to t5. Hence, the A/D converter 7 receives the voltage value (any of V0 to Vn) of the amplitude signal to generate the amplitude value determined with reference to the initial value.

Thereafter, the reference value generator 6 generates the reference value VREF as a ramp signal having a voltage value (Rr). The A/D converter 7 compares the amplitude value with the voltage value (Rr) of the ramp signal and finally converts the amplitude value to a digital value. Such digital values obtained for the individual columns are then selected by the horizontal scanning circuit 9 and outputted outside the solid-state imaging device 1 via the buffer 8, for example.

By evaluating the thus-outputted digital values for the individual columns, the characteristics of the A/D converter 7 can be tested.

As described above, in the solid-state imaging device 1 of Embodiment 1, to keep the test signal TEST supplied to the A/D converter 7 from being affected by the load of the pixel region 4, the vertical signal lines (14-1 to 14-n) are disconnected from the inputs of the A/D converter 7 with the vertical signal line connection circuit 20, to allow the test signal TEST to be directly inputted into the A/D converter 7. Hence, the problem that the test signal TEST is affected by the load of the vertical signal lines (14-1 to 14-n) impairing the precision of the test can be solved.

In testing of the A/D converter 7, the two signals, the reference signal TEST1 and the amplitude signal TEST2, are received at the pads P1 and P2 from outside the solid-state imaging device 1. The test signal selection circuit 23 selectively switches the output between the reference signal TEST1 and the amplitude signal TEST2, to generate the test signal TEST having the reference signal TEST1 and the amplitude signal TEST2 arranged in time series at desired timing. The resultant test signal TEST is inputted into the A/D converter 7 via the test signal input circuit 11. This eliminates the necessity of a test signal generation circuit for generating the test signal TEST having the reference signal TEST1 and the amplitude signal TEST2 arranged in time series inside the solid-state imaging device 1. This also eliminates the necessity of performing a test for checking whether or not a test signal generated by such a test signal generation circuit has attained desired precision for each solid-state imaging device. Hence, the problem of increasing the circuit scale of the solid-stage imaging device and the problem of increasing the test time can be solved. In addition, the problem of the man-hour needed to develop an IC tester for generating the reference signal and the amplitude signal at desired timing in a time-sharing manner and the cost required for this development can be solved.

The communication/timing control circuit 22 inside the solid-state imaging device 1 controls the arrangement of the reference signal TEST1 and the amplitude signal TEST2 received from outside the solid-state imaging device 1 in time series at desired timing. Hence, the IC tester may just supply the amplitude signal TEST2 having a given voltage value at arbitrary timing while continuing supplying the reference signal TEST1. This can solve the problem that it is difficult to synchronize the timing at which the reference signal TEST1 and the amplitude signal TEST2 are supplied from the IC tester to the solid-state imaging device 1 with the timing at which these signals are supplied to the A/D converter 7.

Embodiment 2

In Embodiment 1, the test signal TEST outputted from the test signal selection circuit 23 was supplied to the A/D converter 7 via the test signal input circuit 11.

In such a solid-state imaging device that the A/D converter 7 thereof operates at low speed, however, the test signal TEST generated outside the solid-state imaging device may be supplied to the A/D converter 7 via the test signal input circuit 11 if no problem arises in the development of an IC tester that generates the reference signal and the amplitude signal at desired timing in a time-sharing manner and if the timing at which the reference signal and the amplitude signal are supplied from the IC tester to the solid-state imaging device can be synchronized with the timing at which these signals are supplied to the A/D converter 7. An example of such a solid-state imaging device will be described as follows as Embodiment 2.

Figure 6:
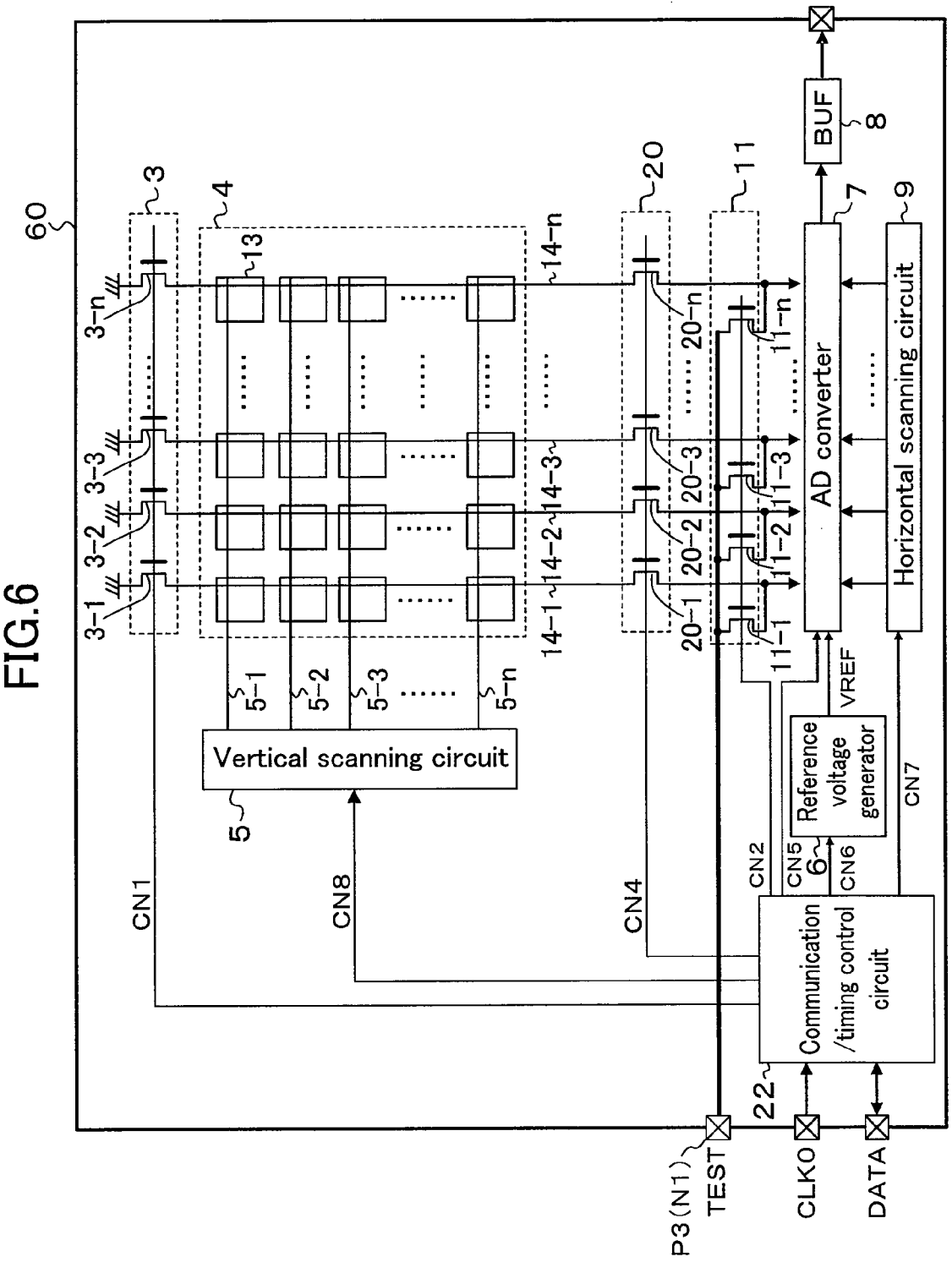
FIG. 6 is a block diagram of a solid-state imaging device of Embodiment 2.

FIG. 6 is a block diagram of a solid-state imaging device 60 of Embodiment 2. Most of the components in FIG. 6 are the same in function as the counterparts in FIG. 1. In this embodiment, therefore, only the difference from the configuration of FIG. 1 will be mainly described.

In the solid-state imaging device 60 of FIG. 6, the test signal TEST is not given from the test signal selection circuit 23 (FIG. 1) but is received at a pad P3 from outside the solid-state imaging device 60. Hence, while two pads, the pad P1 for receiving the reference signal TEST1 and the pad P2 for receiving the amplitude signal TEST2, were required in the solid-state imaging device 1 of FIG. 1, only one pad P3 is required for the solid-state imaging device 60 of FIG. 6. Also, the test signal selection circuit 23 and the control signals CN9 and CN10, which were required for the solid-state imaging device 1 of FIG. 1, are unnecessary for the solid-state imaging device 60 of FIG. 6.

Figure 5:
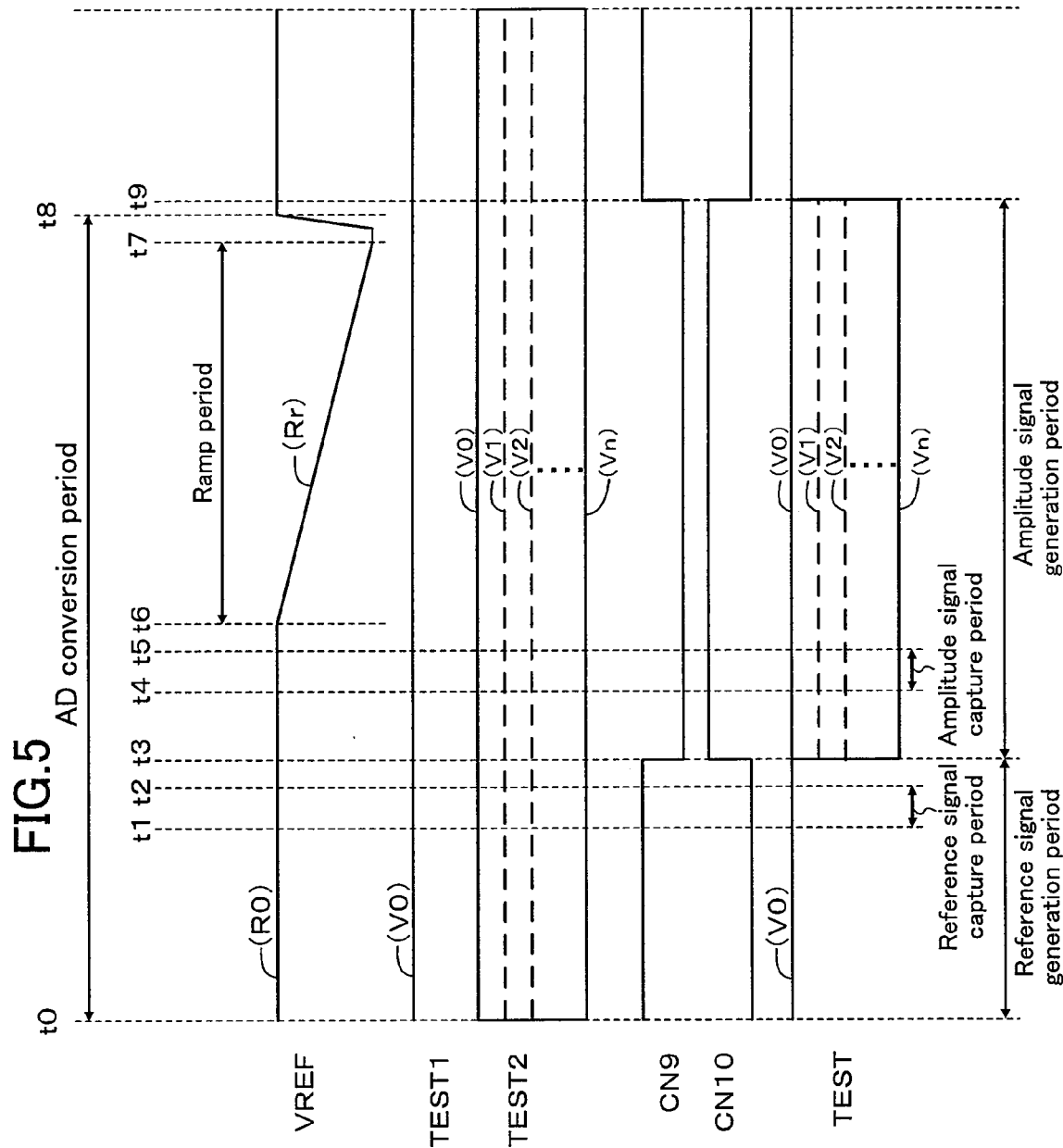
FIG. 5 is a timing chart for demonstrating the operation of the solid-state imaging device of Embodiment 1 during testing of an A/D converter.

As for the operation, the test signal TEST may just be supplied to the pad P3 from outside the solid-state imaging device 60 at the timing shown in FIG. 5 as in Embodiment 1.

As described above, in the solid-state imaging device 60 of Embodiment 2, the test signal TEST generated outside the solid-state imaging device 60 is received at the pad P3 and then directly supplied to the A/D converter 7 via the test signal input circuit 11. This eliminates the necessity of the test signal selection circuit 23 (FIG. 1), and thus provides the effect of reducing the circuit area and the number of pads for test signal input.

Embodiment 3

In Embodiments 1 and 2, the analog signals from the pixel cells 13 are given to the A/D converter 7 via the vertical signal lines (14-1 to 14-n) and the vertical signal line connection circuit 20.

In a solid-state imaging device in which the analog signals from the pixel cells 13 pass through an analog signal processing circuit that amplifies the analog signals, for example, before being given to the A/D converter 7, the vertical signal line connection circuit 20 and the test signal input circuit 11 must be placed so as to ensure that the test signal TEST is unaffected by the analog signal processing circuit.

In Embodiment 3, therefore, a solid-state imaging device having an analog signal processing circuit placed between the pixel region 4 and the A/D converter 7 will be described.

Figure 7:
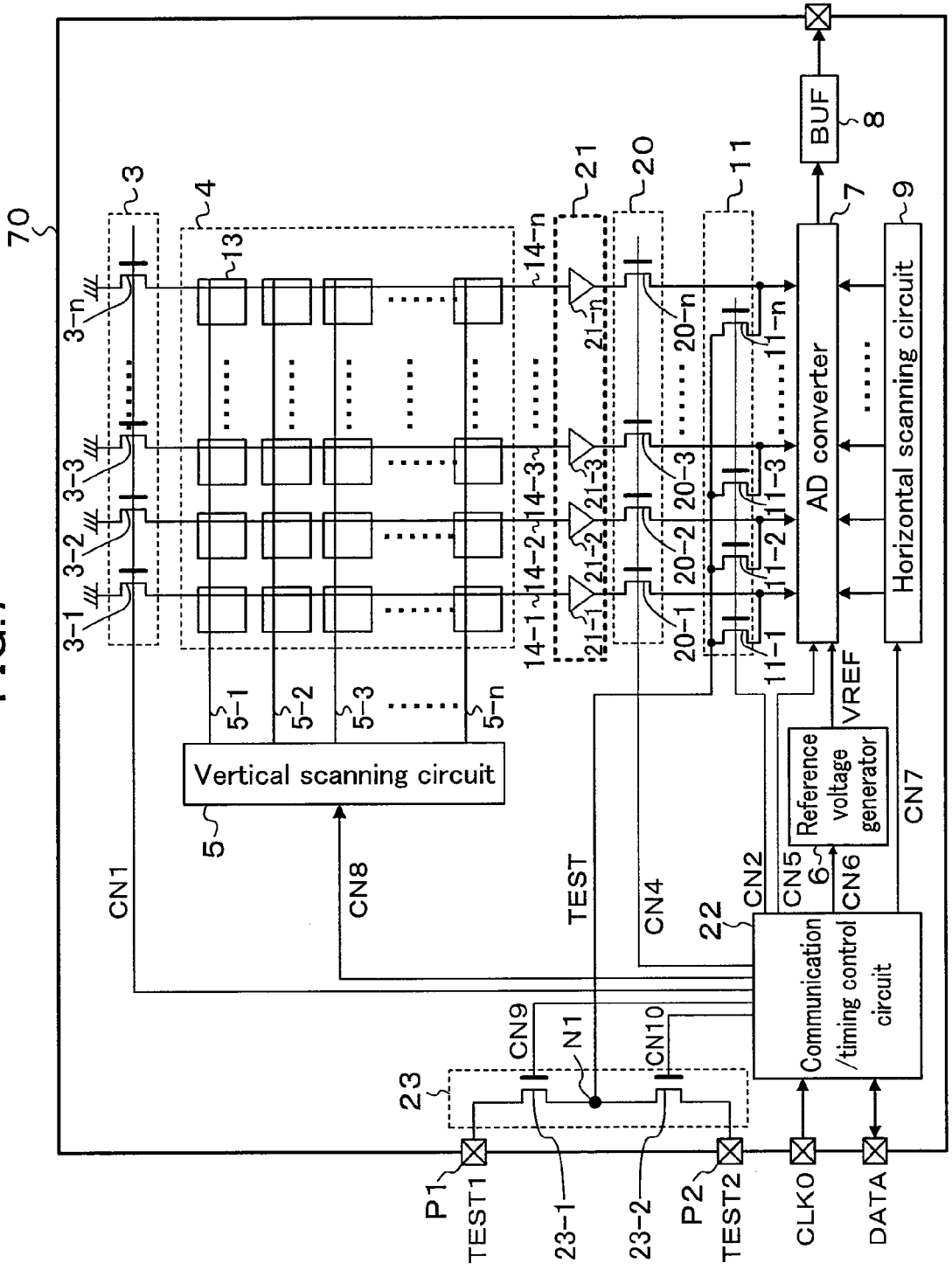
FIG. 7 is a block diagram of a solid-state imaging device of Embodiment 3.

FIG. 7 is a block diagram of a solid-state imaging device 70 of Embodiment 3. Most of the components in FIG. 7 are the same in function as the counterparts in FIG. 1. In this embodiment, therefore, only the difference from the configuration of FIG. 1 will be mainly described.

The solid-state imaging device 70 of FIG. 7 is provided with an analog signal processing circuit 21 that is a circuit for amplifying analog signals from the pixel cells 13, for example, and outputting the amplified signals. The analog signal processing circuit 21 lo may be a circuit having any function as long as it processes analog signals from the pixel cells 13 before the analog signals are inputted into the A/D converter 7. The analog signal processing circuit 21 includes a plurality of analog signal processing elements (21-1 to 21-n) corresponding to the plurality of vertical signal lines (14-1 to 14-n). Each of the analog signal processing elements (21-1 to 21-n) amplifies an analog signal outputted from the corresponding pixel cell 13, for example, and outputs the amplified signal to the corresponding vertical signal line (any of 14-1 to 14-n).

The vertical signal line connection circuit 20 is placed between the analog signal processing circuit 21 and the A/D converter 7. The switch transistors (20-1 to 20-n) of the vertical signal line connection circuit 20 are connected between output nodes of the corresponding analog signal processing elements (21-1 to 21-n) and the inputs of the corresponding A/D conversion circuits (7-1 to 7-n).

The operation is the same as that in Embodiment 1, and thus description thereof is omitted here.

As described above, in the solid-state imaging device 70 of Embodiment 3, in testing of the A/D converter 7, the vertical signal line connection circuit 20 disconnects the vertical signal lines (14-1 to 14-n) and the outputs of the analog signal processing circuit 21 from the inputs of the A/D converter 7. Hence, the test signal TEST is unaffected by the analog signal processing circuit 21. In this way, even in a solid-state imaging device provided with the analog signal processing circuit 21, the test signal TEST will not be affected by the analog signal processing circuit 21, and hence highly precise testing can be performed for the A/D converter 7.

Embodiment 4

In Embodiments 1 to 3, the reference signal TEST1 and the amplitude signal TEST2, or the test signal TEST, are supplied to the solid-state imaging device externally. Alternatively, a circuit for generating the test signal TEST may be incorporated in the solid-state imaging device if the solid-state imaging device has enough room for accommodating another circuit and also can sufficiently afford to increase the test time. In Embodiment 4, therefore, a solid-state imaging device incorporating a circuit for generating the test signal TEST will be described.

Figure 8:
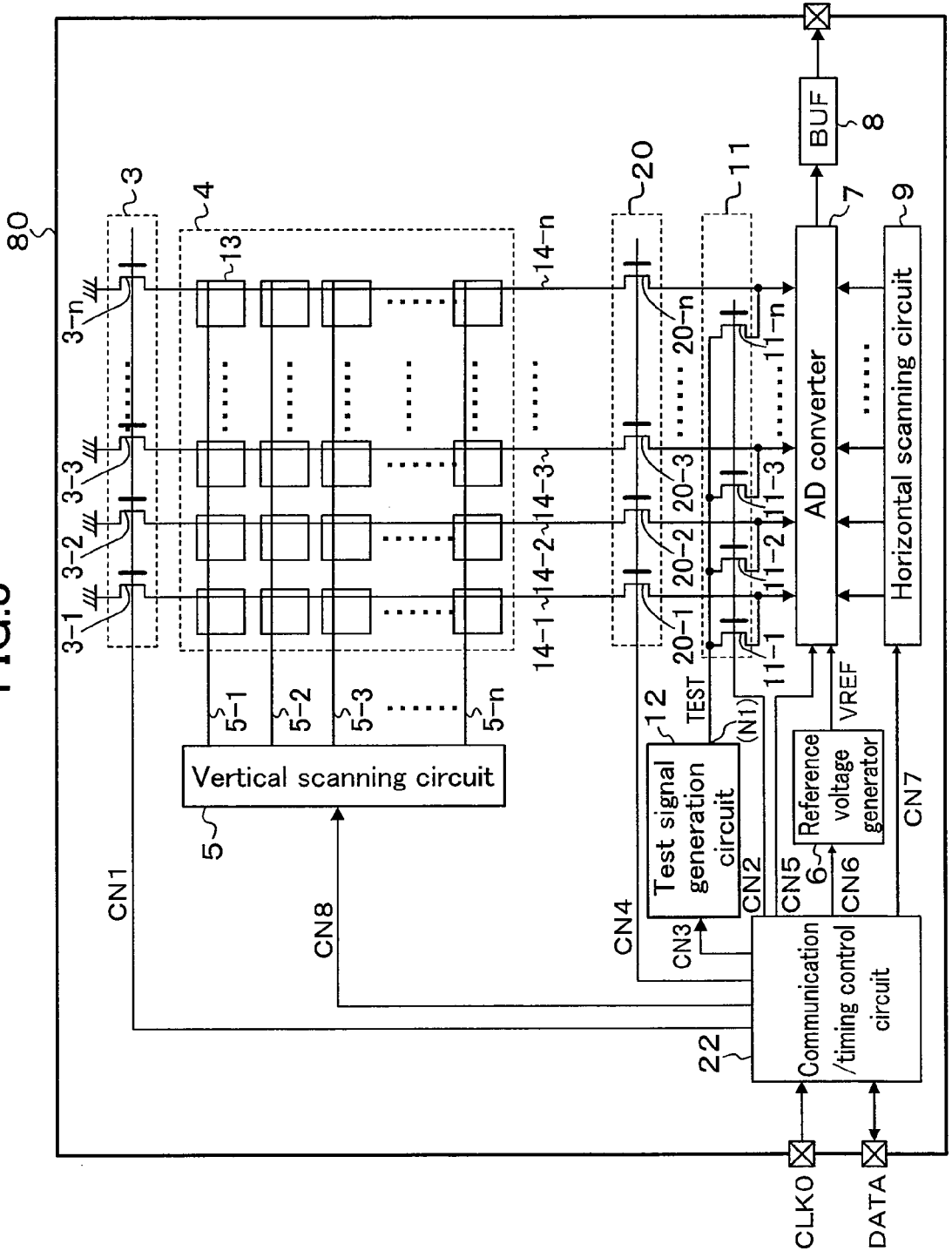
FIG. 8 is a block diagram of a solid-state imaging device of Embodiment 4.

FIG. 8 is a block diagram of a solid-state imaging device 80 of Embodiment 4. Most of the components in FIG. 8 are the same in function as the counterparts in FIG. 1. In this embodiment, therefore, only the difference from the configuration of FIG. 1 will be mainly described.

A test signal generation circuit 12 generates the test signal TEST having the reference signal and the amplitude signal arranged in time series at desired timing and outputs the resultant test signal in response to a control signal CN3. As for the operation, the test signal TEST may just be outputted from the test signal generation circuit 12 at the timing shown in FIG. 5 as in Embodiment 1.

As described above, the solid-state imaging device 80 of FIG. 8 includes the test signal generation circuit 12 for generating the test signal TEST. Therefore, it is unnecessary to prepare the test signal to be supplied to the A/D converter 7 externally. Hence, the following effects are obtained: a mechanism for generating the reference signal and the amplitude signal, or the test signal TEST, is no more necessary in an IC tester; and pads (P1, P2, P3) for receiving the reference signal TEST1 and the amplitude signal TEST2, or the test signal TEST, are no more necessary.

Other Embodiments

While the present invention has been described in preferred embodiments, it is to be understood that the technical range of the present invention is not limited to these embodiments but like changes and modifications may be made without departing from the spirit of the present invention. Such changes and modifications should also be included within the technical range of the present invention For example, in Embodiment 2 (FIG. 6) described above, the test signal TEST was supplied from outside the solid-state imaging device 60. In this relation, for instruction on the timing at which the reference signal TEST1 and the amplitude signal TEST2 should be supplied from outside as the test signal TEST, information corresponding to the control signals CN9 and CN10 may be outputted outside the solid-state imaging device 60 via the pad for the data DATA, for example.

The solid-state imaging devices 60 and 80 of FIGS. 6 and 8 may be provided with the analog signal processing circuit 21 in Embodiment 3 (FIG. 7) described above.

The communication/timing control circuit 22 in the above embodiments was described as a circuit for outputting the clock signals, pulse signals, control signals and the like required for the individual blocks as the signals CN1 to CNn based on the clock CLK0 and the data DATA received from outside the solid-state imaging devices 1, 60 and 80. Alternatively, the communication/timing control circuit 22 may generate the signals CN1 to CNn according to the state of a signal supplied via an arbitrary pad and output the generated signals.

The A/D converter 7 in the above embodiments may be any converter that converts an analog signal to a digital signal. For example, the A/D converter described in Patent Document 2 may be adopted.

Figure 9:
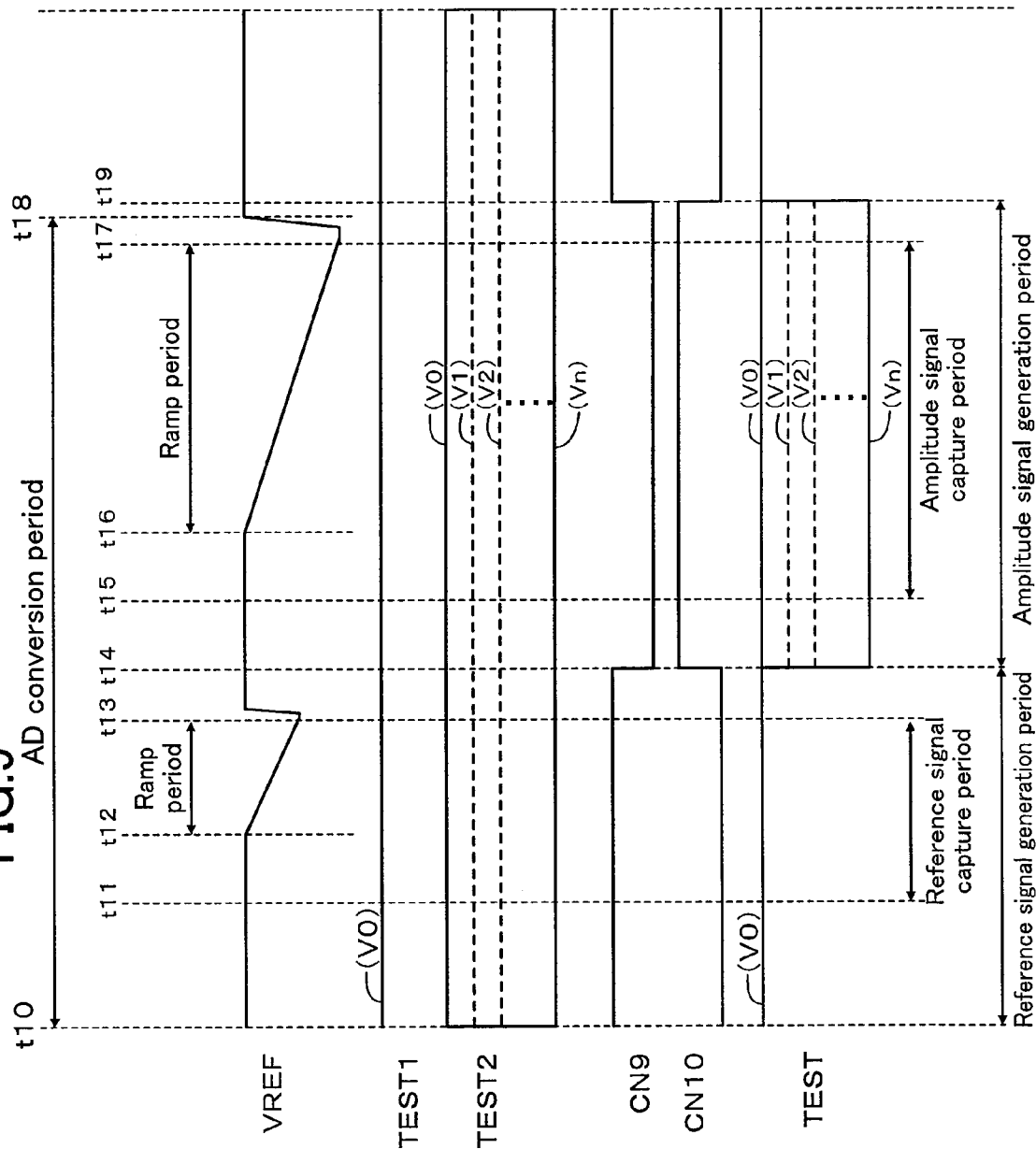
FIG. 9 is a timing chart for demonstrating the operation of the solid-state imaging device of FIG. 1 observed when an A/D converter in Patent Document 2 is adopted.

For example, FIG. 9 is a timing chart observed when the A/D converter described in Patent Document 2 is adopted as the A/D converter 7 of the solid-state imaging device 1 of FIG. 1. The A/D converter in Patent Document 2 requires two ramp signals, a ramp signal (Rr1) for comparison with the reference signal and a ramp signal (Rr2) for comparison with the amplitude signal, as the reference voltage VREF. The reference signal TEST1 having the voltage value (V0) is supplied to the A/D converter 7 as the test signal TEST during t10 to t14 with the signal CN9. The A/D converter 7 compares the reference signal TEST1 (V0) with the ramp signal (Rr1) of the reference voltage VREF during t12 to t13 and holds a digital value (down-count value) obtained at the time of matching. Thereafter, the amplitude signal TEST2 having any of the voltage values V0 to Vn is supplied to the A/D converter 7 as the test signal TEST during t14 to t19 with the signal CN10. The A/D converter 7 compares the amplitude signal TEST2 (any of V0 to Vn) with the ramp signal (Rr2) of the reference voltage VREF during t16 to t17 and holds a digital value (value up-counted from the previous down-count value) obtained at the time of matching. Such digital values obtained for the individual columns are then selected by the horizontal scanning circuit 9 and outputted outside the solid-state imaging device 1 via the buffer 8, for example. By evaluating the thus-outputted digital values for the individual columns, the characteristics of the A/D converter 7 can be tested.

The solid-state imaging device 60, 70 and 80 of FIGS. 6, 7 and 8 may be provided with the sample/hold circuits (200-1 to 200-n) in Embodiment 1 (FIG. 2) described above. With this, the circuit area for testing the A/D converter 7 can be reduced.

In this case, however, the capacitance for the sample/hold circuits is to be placed between the vertical signal line connection circuit 20 and the test signal input circuit 11. It should therefore be noted that extra time transition corresponding to this capacitance will occur at the switching of the test signal TEST between the reference signal and the amplitude signal.

In the embodiments described above, when the A/D converter 7 is not being tested, the test signal TEST is in high impedance, and this may possibly turn ON the switch transistors (11-1 to 11-$n$) of the test signal input circuit 11. To prevent this, the test signal TEST may be fixed to a voltage with which the switch transistors (11-1 to 11-$n$) do not turn ON.

In the embodiments described above, the A/D converter 7 was tested via all of the switch transistors (11-1 to 11-$n$) of the test signal input circuit 11. Alternatively, the A/D converter 7 may be tested via part of the switch transistors (11-1 to 11-$n$) under individual ON/OFF control of the switch transistors (11-1 to 11-$n$) with the control signal CN2.

In the embodiments described above, the switch transistors (11-1 to 11-$n$) of the test signal input circuit 11 can be connected to the vertical signal lines (14-1 to 14-$n$) through the switching of the vertical signal line connection circuit 20. Alternatively, the switch transistors (11-1 to 11-$n$) may not be connected to the vertical signal lines (14-1 to 14-$n$). To state specifically, an A/D converter that operates only during testing of the A/D converter 7 may be provided in the A/D converter 7, and the test signal TEST may be supplied to such an A/D converter. This configuration provides the effect that, during image sensing operation of the solid-state imaging device, the A/D converter can operate without being affected by the load of the test circuit. Another effect that the number of circuits for testing can be reduced can also be obtained.

In the embodiments described above, the ramp signals Rr, Rr1 and Rr2 of the reference voltage VREF were described as monotonously decreasing signals. Any signal may otherwise be adopted as long as the reference voltage VREF can be supplied to the A/D converter 7 as an appropriate signal.

In the embodiments described above, the voltage values V0 to V$n$ of the amplitude signal of the test signal TEST were described as being lower in this order. Any signal may otherwise be adopted as long as the voltage values of the amplitude voltage can be supplied to the A/D converter 7 as appropriate signal values.

In the embodiments described above, the voltage value V0 of the reference signal of the test signal TEST was described as being fixed at all times. Alternatively, it may be a variable voltage value.

In the embodiments described above, the voltage value V0 of the reference signal of the test signal TEST and the voltage value V0 of the amplitude signal thereof were the same. Alternatively, they may be different from each other.

In the embodiments described above, it was assumed that a single A/D converter 7 was provided. Alternatively, a plurality of A/D converters 7 may be provided. In this case, a common test signal TEST may be supplied to the plurality of A/D converters 7 via a common test signal input circuit 11, or different test signals TEST may be supplied to the plurality of A/D converters 7 via a plurality of test signal input circuits 11.

In the embodiments described above, the format adopted at the output of the A/D-converted digital values via the buffer 8 was not specifically described. The digital values of plural bits for the individual columns may be outputted as parallel data as they are, or may be outputted after being converted to serial data. Otherwise, a synchronous signal may be attached to the digital values to facilitate image processing after the output.

What is claimed is:
1. A solid-state imaging device comprising:
a pixel region having a plurality of pixel cells arranged in an array, each of the pixel cells including an optoelectronic conversion element;
a pixel cell selection circuit for selecting pixel cells in the pixel region;
a plurality of vertical signal lines to which signals at pixel cells selected by the pixel cell selection circuit are read; and
an A/D converter for A/D-converting signals read to the vertical signal lines,
wherein the solid-state imaging device further comprises:
a first node for receiving a first signal inputted from outside the solid-state imaging device;
a second node for receiving a second signal inputted from outside the solid-state imaging device;
a test signal selection circuit for outputting the first signal received at the first node and the second signal received at the second node as a test signal by switching between the first signal and the second signal at desired timing; and
a test signal input circuit for supplying the test signal from the test signal selection circuit to an input of the A/D converter,
the first signal is a signal corresponding to a pixel reset signal level supplied from the pixel cells to the A/D converter via the vertical signal lines when the pixel cells are reset, and
the second signal is a signal corresponding to a pixel signal level supplied from the pixel cells to the A/D converter via the vertical signal lines when charges stored in the optoelectronic conversion elements of the pixel cells are read from the optoelectronic conversion elements.

2. The solid-state imaging device of claim 1, wherein the test signal selection circuit outputs the first signal received at the first node as the test signal for a first time period and then outputs the second signal received at the second node as the test signal for a second time period.

3. The solid-state imaging device of claim 1, wherein the test signal input circuit comprises:
a first switch circuit for connecting/disconnecting the vertical signal lines to/from the input of the A/D converter;
a second switch circuit for connecting/disconnecting a third node for receiving the test signal from the test signal selection circuit to/from the input of the A/D converter; and
a control circuit for controlling ON/OFF of the first and second switch circuits.

4. The solid-state imaging device of claim 3, wherein the first switch circuit is placed in a region between the pixel region and the A/D converter.

5. The solid-state imaging device of claim 3, wherein the second switch circuit is placed in a region between the pixel region and the A/D converter.

6. The solid-state imaging device of claim 3, further comprising:
a fourth node connected to the input of the A/D converter, wherein one terminal of each of the vertical signal lines is connected to a load transistor,
the first switch circuit connects/disconnects the other terminal of each of the vertical signal lines to/from the fourth node, and
the second switch circuit connects/disconnects the third node to/from the fourth node.

7. The solid-state imaging device of claim 3, further comprising:

an analog signal processing circuit for processing signals read from pixel cells selected by the pixel cell selection circuit to the vertical signal lines, wherein the first switch circuit connects/disconnects an output node of the analog signal processing circuit to/from the input of the A/D converter.

8. The solid-state imaging device of claim 3, further comprising:

a sample/hold circuit placed between the pixel region and the A/D converter for holding signals read to the vertical signal lines, wherein the first switch circuit further has a function of switching the sample/hold circuit between a sample state and a hold state.

9. The solid-state imaging device of claim 3, wherein the A/D converter includes a plurality of A/D conversion circuits corresponding to the plurality of vertical signal lines, the first switch circuit includes a plurality of first switches corresponding to the plurality of vertical signal lines, each of the plurality of first switches connects/disconnects its corresponding vertical signal line to/from an input of an A/D conversion circuit corresponding to the vertical signal line, the second switch circuit includes a plurality of second switches corresponding to the plurality of A/D conversion circuits, each of the plurality of second switches connects/disconnects an input of its corresponding A/D conversion circuit to/from the third node, and the control circuit controls ON/OFF of the plurality of second switches individually.

10. The solid-state imaging device of claim 3, wherein when the A/D converter is not being tested, the third node is fixed to a given voltage value to ensure that the test signal is not supplied to the A/D converter via the second switch circuit.

* * * * *